United States Patent [19]

Vitale

[11] 4,241,698
[45] Dec. 30, 1980

[54] VACUUM EVAPORATION SYSTEM FOR THE DEPOSITION OF A THIN EVAPORATED LAYER HAVING A HIGH DEGREE OF UNIFORMITY

[75] Inventor: George Vitale, Torrance, Calif.

[73] Assignee: MCA Discovision, Inc., Universal City, Calif.

[21] Appl. No.: 10,578

[22] Filed: Feb. 9, 1979

[51] Int. Cl.³ ............................................. C23C 13/08
[52] U.S. Cl. ...................................... 118/730; 118/50; 204/298; 269/57; 432/124
[58] Field of Search ................ 118/729, 730, 715, 50; 204/298; 219/278; 269/57; 74/660; 432/124, 121

[56] References Cited

U.S. PATENT DOCUMENTS

| | | | |
|---|---|---|---|
| 3,633,537 | 1/1972 | Howe | 118/730 X |
| 3,643,625 | 2/1972 | Mahl | 118/730 X |
| 3,675,619 | 7/1972 | Burd | 118/730 X |
| 3,749,058 | 7/1973 | Slabaugh | 74/660 X |
| 3,783,821 | 1/1974 | Dobson et al. | 269/57 X |
| 3,783,822 | 1/1974 | Wollam | 118/730 X |
| 3,797,452 | 3/1974 | Dobson | 118/730 |
| 3,853,091 | 12/1974 | Christenson et al. | 269/57 X |
| 3,892,198 | 7/1975 | Dobson | 118/730 |
| 3,991,707 | 11/1976 | Thelen et al. | 118/730 X |
| 4,048,223 | 7/1978 | Ertl | 432/124 |

*Primary Examiner*—Edward C. Kimlin
*Attorney, Agent, or Firm*—Ronald J. Clark

[57] ABSTRACT

A substrate carrier assembly is described which employs a frame, a plurality of rollers, a plurality of substrate carrier rings, captively held within the frame and a carrier support track. The substrate carrier assembly provides support and constraint to a plurality of substrate members, while the substrate members are coated with a thin evaporated layer. The physical configuration provided insures that a uniformly thin metal layer is formed over the substrate member.

5 Claims, 8 Drawing Figures

VACUUM EVAPORATION SYSTEM FOR THE DEPOSITION OF A THIN EVAPORATED LAYER HAVING A HIGH DEGREE OF UNIFORMITY

BACKGROUND OF THE INVENTION

1. Field of the Invention

The present invention relates to the formation of a thin evaporated layer upon the surface of a substrate member.

More specifically, an apparatus is described for constraining a substrate member in a vacuum evaporation system without detrimentally affecting the formation of a thin evaporated layer.

A novel means of constraining the substrate member is described.

2. Description of Prior Art

The prior art is limited to a carousel type substrate carrier assembly for restraining a substrate member about its central axis such that the substrate member will rotate about this central axis. This carousel type of substrate carrier assembly is utilizable in temporarily mounting a substrate member into a vacuum evaporation system.

Anyone skilled in the art of forming a thin evaporated layer on a substrate member will know that, in the past, where a comparatively large substrate was to be coated with a thin evaporated film, the substrate member was placed in the vacuum evaporation system in a stationary manner with the side of the substrate member to be coated face down. Achieving a consistent film thickness over the face of a comparativly large substrate was virtually impossible due to the dispersion characteristics of a vacuum evaporated layer. Additionally, a substrate clamp, used to hold the substrate to the carrier assembly, interferes with the uniform evaporation of the metal on the substrate surface. This interference is commonly known as the shadow effect.

SUMMARY OF THE INVENTION

The present invention relates to an apparatus for constraining a substrate member within a vacuum evaporation system.

The combination of the present invention includes a plurality of substrate carrier rings for supporting the substrate members, a frame for holding, separating and supporting the substrate carrier rings, a plurality of rolling members disposed upon the frame and constraining the plurality of substrate carrier rings without detrimentally affecting the rotation of the plurality of substrate carrier rings and a carrier support track for supporting the substrate carrier assembly.

DESCRIPTION OF THE PREFERRED EMBODIMENT

Figure 1A:
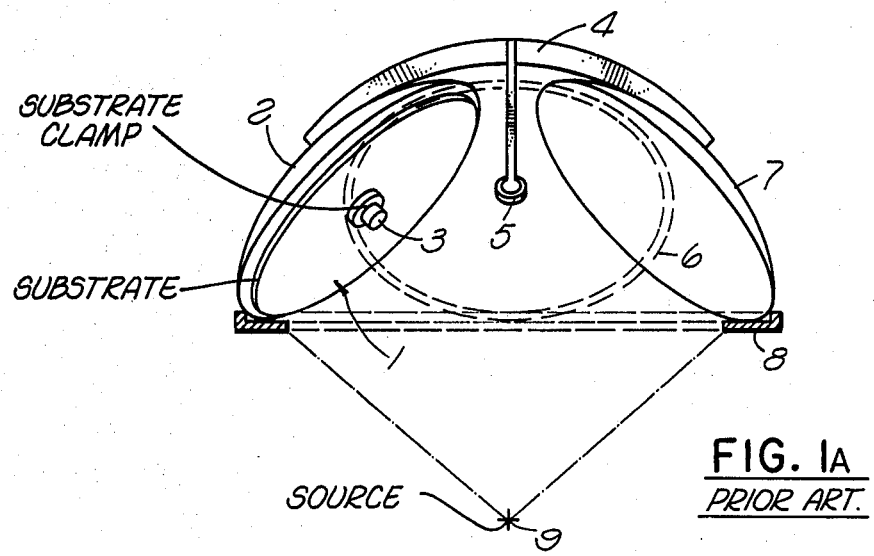
FIGS. 1A, 1B and 1C illustrate the prior art.
Figure 1B:
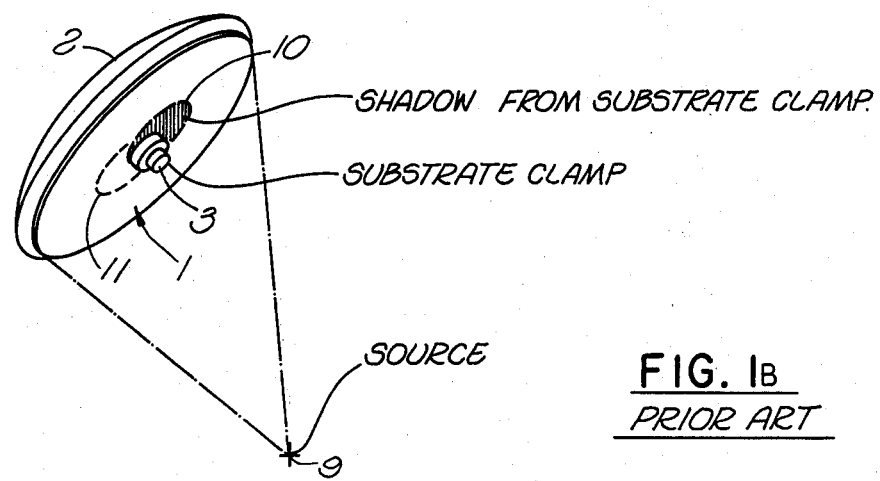
Figure 1C:
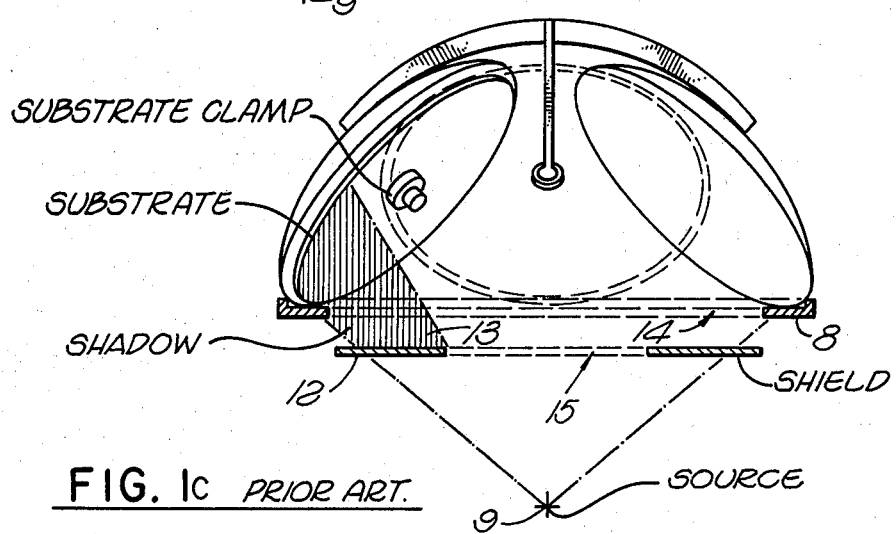

Referring collectively to the prior art structures shown in FIGS. 1A, 1B and 1C, a substrate member 1 is shown mounted to a substrate carrier dome 2 by means of a substrate clamp 3, the substrate clamp is attached to a threaded screw-type device not shown in FIG. 1A. The substrate carrier dome 2 is attached to a substrate carrier framework 4 at the point of attachment 5. The carousel type substrate carrier assembly is provided with a plurality of substrate carrier domes indicated at 2, 6 and 7.

The primary support for the substrate carrier assembly is provided by a substrate carrier support track 8.

A source 9 provides a vacuum evaporated film which is formed upon the substrate member 1.

The carousel type of substrate carrier assembly alleviates some of the problems which exist with a stationary substrate member, but in so doing the carousel-type substrate carrier assembly generates other more objectionable problems.

Referring now to FIG. 1B, there is illustrated the problems associated with the carousel-type substrate carrier assembly.

The substrate member 1, is mounted to the substrate carrier dome 2 by the substrate clamp 3. This method of constraint causes an area where there is no formation of an evaporated layer. This area corresponds directly to the diameter of the substrate clamp 3.

A second problem inherent with this type of constraint is a shadow 10 produced by the size of the substrate clamp 3. The size of the substrate clamp 3 can be reduced to minimize the effect of this shadowing. However, this is not an effective answer to the problems faced in using the carousel type substrate carrier assembly.

The shadow 10 extends about the inner area of the substrate member 1 as the substrate member 1 rotates in the carousel-type substrate carrier assembly. The extent of the shadow 10 is indicated by a broken line 11.

FIG. 1C illustrates one attempt to eliminate the problem shadowing.

A shield 12 is interposed between the substrate member 1 and the source 9. This shield 12 provides a second shadow 13. This shadow 13 effectively reduces the amount of material which is deposited upon the substrate member 1, thus eliminating the overall effects of the shadow 10 of the substrate clamp 3, yielding a more uniform thickness profile across the surface of the substrate member 1.

The difficulty with the shield 12 arises in the handling of the substrate member 1.

The carousel-type substrate carrier assembly requires that the substrate member 1 be mounted on the source of the substrate dome 2. The substrate member 1 must pass through the opening 14 of the carrier support track 8. The shield further reduces the available area provided to a handler of the substrate member 1 as indicated by a reduced shield opening 15.

Anyone skilled in the art, recognizes the importance of minimizing handling difficulties where a substrate member must be absolutely clean and free from fingerprints and surface anomalies such as scratches, pits and deformities in layers which may already be formed upon the substrate member.

The present invention addresses itself to the problems of substrate member constraint, shadowing and handling difficulties.

Figure 2:
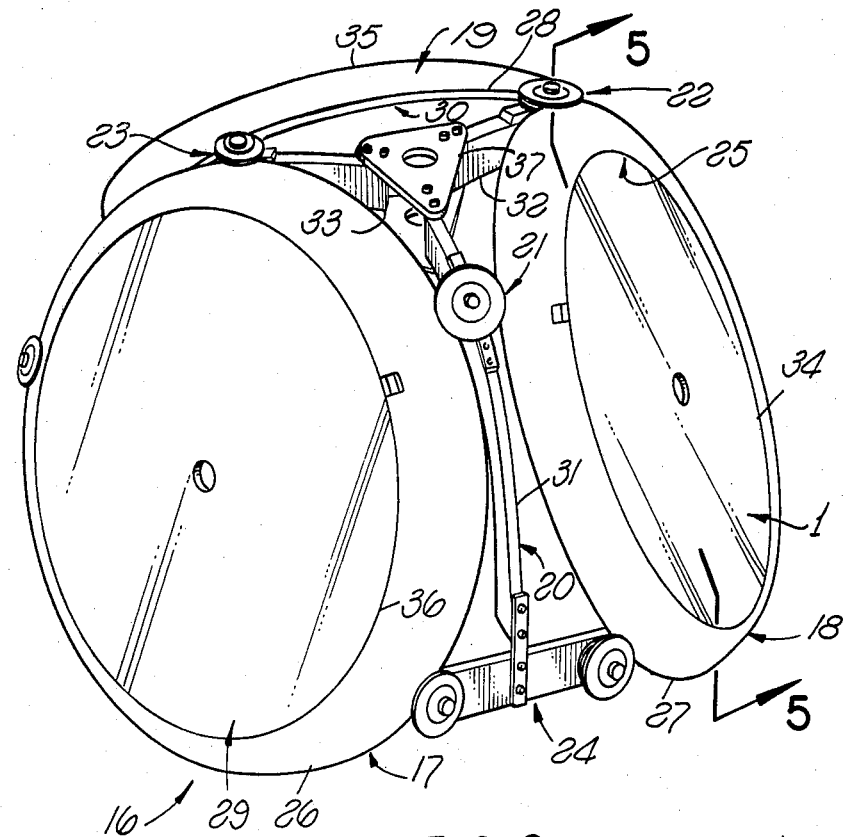
FIG. 2 illustrates the present invention.

Referring now to FIG. 2, a substrate carrier assembly 16 is provided with a plurality of substrate carrier rings 17, 18 and 19. The substrate carrier rings are substantially circular members, and provided with a recess 25. The recess 25 is a substantially cylindrical member. The primary support to the plurality of substrate members 1, 29 and 30, is provided by an annular ring member. The recess 25, is shown in detail in FIG. 5.

The substrate carrier rings 17, 18 and 19, are supported within a frame 20, the frame comprises a plurality of frame arms 31, 32 and 33. Mechanically conjoined to the frame arms 31, 32 and 33, are a plurality of upper rollers 21, 22 and 23. The frame 20 is further provided with a plurality of lower rollers, only one of these lower rollers is shown in this figure and is indicated at 24.

The substrate carrier rings 17, 18 and 19, are supported by the frame 20, through the upper rollers 21, 22 and 23, and the lower rollers. The plurality of rollers contact the substrate carrier rings 17, 18 and 19 about the outer peripheries 25, 26 and 27, of the substrate carrier rings 17, 18 and 19. The plurality of upper rollers 21, 22 and 23, and the plurality of lower rollers cooperate with the frame 20 and the substrate carrier rings 17, 18 and 19 in holding, separating and supporting the substrate carrier rings 17, 18 and 19 while permitting rotation of the plurality of substrate carrier rings 17, 18 and 19.

The substrate member 1, is disposed within the cylindrical recess 25, provided in the substrate carrier ring 18, such that the substrate member 1, is held about the substrate member's outer periphery 34. As the substrate carrier ring 18, rotates within the frame 20, the substrate member 1, is rotated. This rotation provides for an even formation of a thin evaporated layer on the source side of the plurality of substrate members 1, 29 and 30.

Since the substrate members 1 are held about the substrate member's outer periphery 34, the shadowing problem as identified in FIG. 1B is eliminated.

Figure 3:
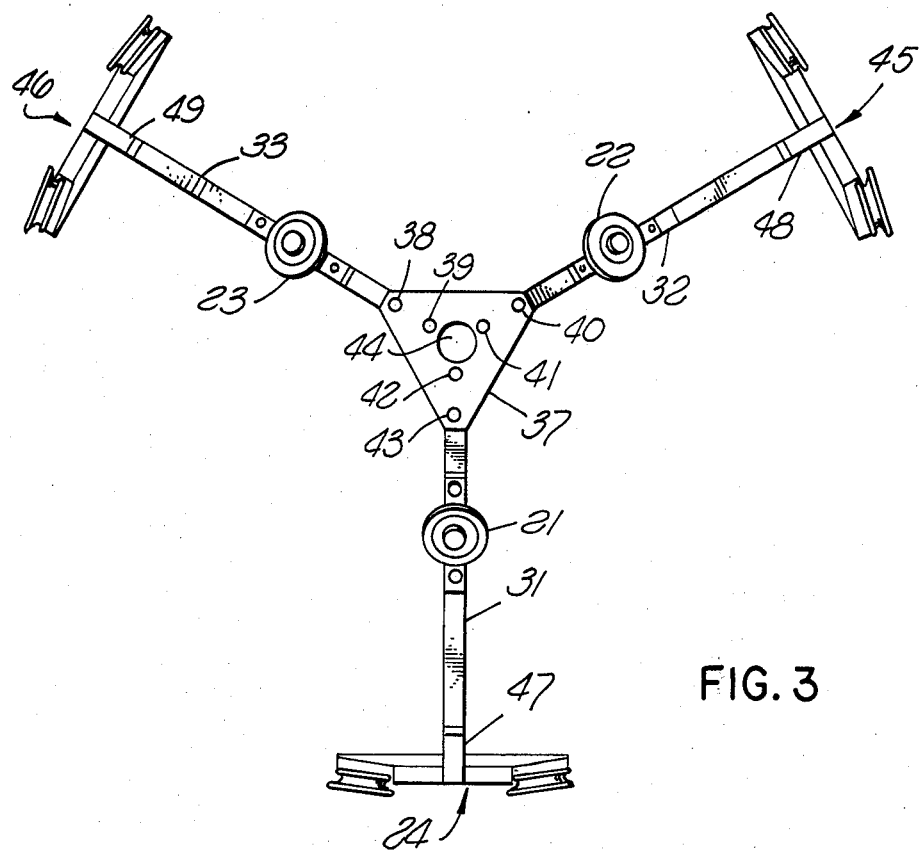
FIG. 3 is a top plane view of the frame.

Referring now to FIG. 3, there is shown a top plan view of the frame 20, which is provided with a plurality of frame arms 31, 32 and 33. The frame arms 31, 32 and 33 are mechanically conjoined at a mounting bracket 37 by a plurality of threaded screw-type devices 38, 39, 40, 41, 42 and 43.

The frame arms 31, 32 and 33 extend outward from the central axis 44 of the mounting bracket 37. Each of the frame arms 31, 32 and 33 are equidistant from each of the other frame arms.

Also shown in this Figure, is the arrangement of the plurality of upper rollers 21, 22 and 23, and the placement of the plurality of lower rollers 24, 45 and 46.

This specific arrangement of the plurality of upper rollers 21, 22 and 23, and lower rollers 24, 45 and 46, provides that the plurality of the substrate carrier rings 17, 18 and 19, are supported proximate to the mounting bracket 37 and further supported at the terminal ends 47, 48 and 49, of the frame arms 31, 32 and 33, thus providing the requisite support to the substrate carrier rings 17, 18 and 19.

Figure 4:
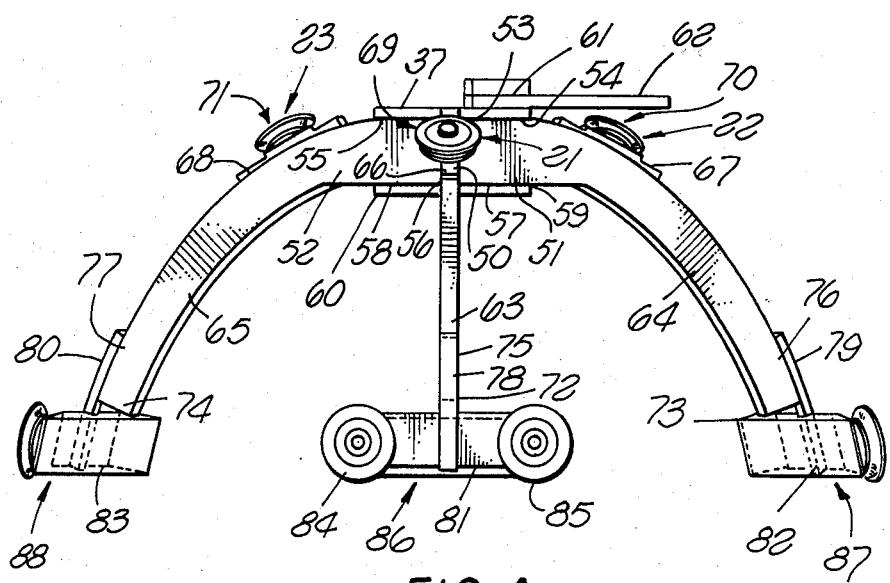
FIG. 4 is an elevation view of the frame.

Referring now to FIG. 4, there is shown an elevation view of the frame.

Each of the plurality of frame arms 31, 32 and 33, is provided with a first end portion indicated at the points 50, 51 and 52. Each of the first end portions 50, 51 and 52, is provided with an upper surface and a lower surface. The upper surfaces are indicated at 53, 54 and 55, respectively. The lower surfaces are indicated at the points of 56, 57 and 58, respectively. The upper surfaces 53, 54 and 55 and lower surfaces 56, 57 and 58 of each of the first end portions 50, 51 and 52 of frame arms 31, 32 and 33 are substantially parallel and coplanar with each of the corresponding upper 53, 54 and 55, and lower surfaces 56, 57 and 58 of each of the other frame arms 31, 32 and 33.

The upper surfaces 53, 54 and 55 provide a mounting platform for the mounting bracket 37. The lower surfaces 56, 57 and 58 provide a coplanar point of attachment 59 for a second mounting bracket 60. The frame arms 31, 32 and 33, and the mounting brackets 37 and 60, cooperate to form a rigid frame 20.

The mounting bracket 37, further provides a point of mechanical attachment 61 for a drive arm 62.

The frame arms 31, 32 and 33 are further provided with arc portions 63, 64 and 65, respectively. The arc portions 63, 64 and 65 of each of the frame arms 31, 32 and 33 extend outward and downward from each of the first end portions 50, 51 and 52, of the frame arms 31, 32 and 33 and describe segments of great circles.

Disposed upon the arc portions 63, 64 and 65 are the upper rollers 21, 22 and 23. The upper rollers 21, 22 and 23 are provided with a plurality of adjustable mounting brackets 66, 67 and 68, respectively.

The combination of the upper rollers 21, 22 and 23 and the adjustable mounting brackets 66, 67 and 68, form the upper rolling assemblies 69, 70 and 71.

The frame arms 31, 32 and 33, are further provided with second end portions 72, 73 and 74, respectively. Each of these second end portions 72, 73 and 74 provides a mounting point 75, 76 and 77 for a lower mounting bracket. The lower mounting brackets are indicated at 78, 79 and 80, respectively. Attached to the lower mounting brackets 78, 79 and 80, are a plurality of mounting plates, indicated at 81, 82 and 83, respectively. Disposed upon the mounting plates 81, 82, and 83, respectively are a plurality of rollers. Two of the rollers are shown at 84 and 85.

Each of the lower rolling assemblies 86, 87 and 88 is formed by a combination of lower mounting brackets 78, 79 and 80, the mounting plates 81, 82 and 83, and a plurality of rollers.

Figure 5:
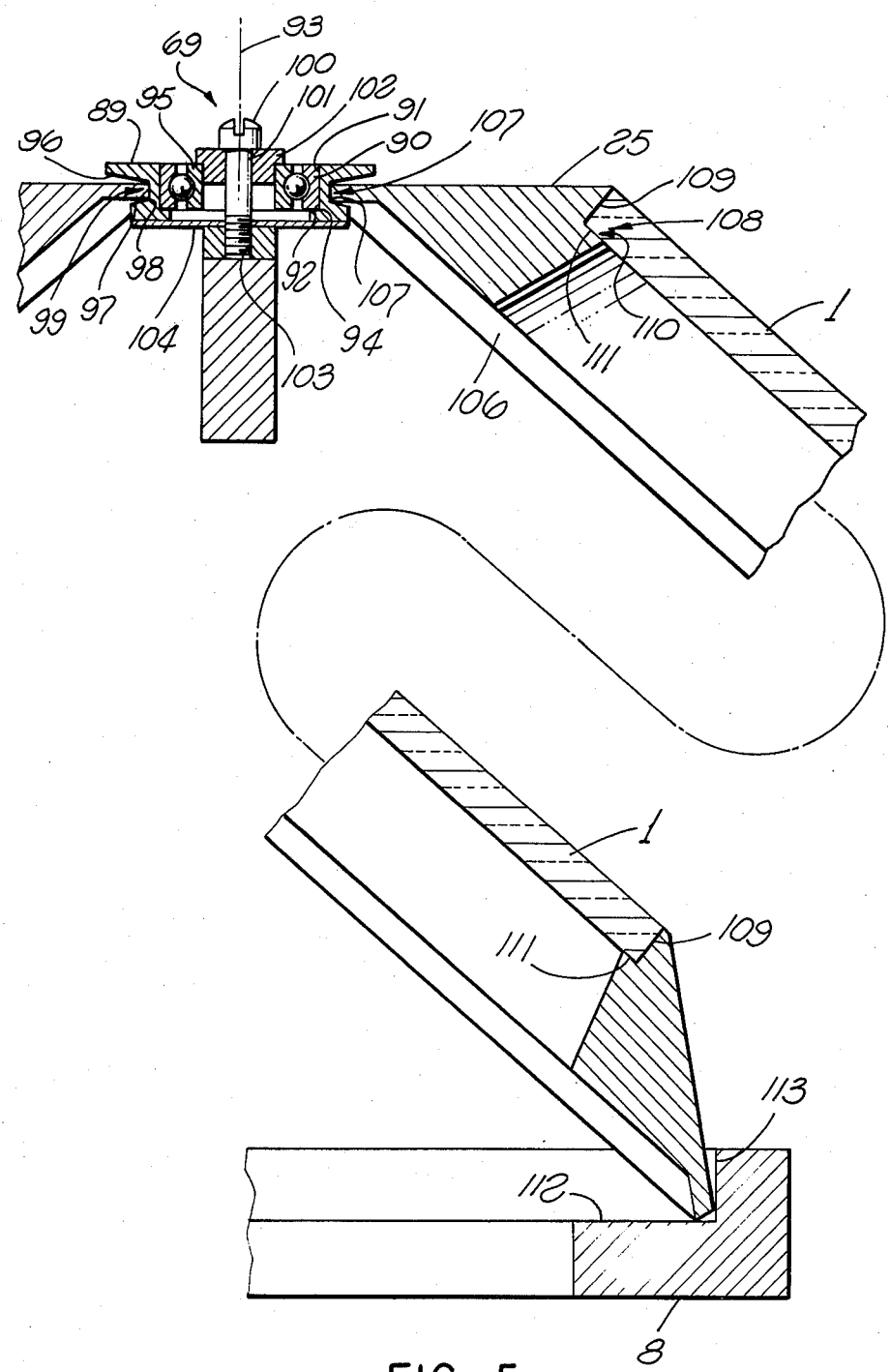
FIG. 5 is a cross-sectional view of the present invention taken on the line 5 of FIG. 2.

Referring now to FIG. 5, there is shown a cross-sectional view taken on the line 5 of FIG. 2.

The upper roller assembly 69, is provided with a roller 89. The roller 89 is a substantially cylindrical member provided with a recess 90. The recess 90, of the roller 89, is formed by a first surface 91 and a second surface 92. The first surface 91, is a substantially cylindrical member which lies in a plane parallel to the central axis 93 of the roller 89. The second surface 92, is an annular ring-shaped surface 94 lying perpendicular to the first surface 91. Disposed within the recess 90 formed by the first surface 91, and the second surface 92, of the roller 89, is a bearing 95. The bearing 95, provides nearly frictionless rotation of the roller 89. The bearing 95 is maintained within the roller 89, by means of a press fit.

The roller 89, is further provided with an upper lip 96 and a lower lip 97. The upper lip 96, and the lower lip 97, are joined by a connective surface 98. The upper lip 96, the lower lip 97 and the connective surface 98, form a groove 99. The groove 99 lies in a plane parallel to the axis of rotation of the roller 89.

The roller 89 is mechanically restrained about its central axis 93 by a threaded screw-type device 100. The screw 100 passes through an aperture 101 in an adaptor 102. The screw 100 engages a threaded aperture 103, in the adjustable mounting bracket 66. The adjustable mounting bracket 66, is constrained to the frame arm 31, as described in FIG. 4.

Interposed between the roller 89, and the adjustable mounting bracket 66, is a shield 104. The shield 104, is provided to guard the bearing 95 against deposition of a thin evaporated layer inside the bearing 95. Sealed bearings cannot be used in a vacuum evaporation system. The lubricant employed in a sealed bearing outgasses in a vacuum evaporation system and pollutes the vacuum system environment.

The substrate carrier ring 18 is provided with a track 105. The track 105, is formed by the outer periphery 25, and a first recess 106. The track 105, is provided with an engagement surface 107. The engagement surface 107 of the track 105, cooperates with groove 99, of the roller 89, in holding, separating and supporting the substrate ring 18. The engagement surface 107, of the substrate carrier ring 18, lies in a plane parallel to the axis of rotation 93 of the roller 89.

The substrate carrier ring 18 is further provided with a second recess 108. The second recess 108, is formed by a first surface 109, and a second surface 110. The first surface 109, is a substantially cylindrical member. The first surface 109, acts as one of the two surfaces of constraint for the substrate member 1. The second surface 110, of the substrate carrier ring 18, is an annular ring 111 arranged perpendicular to the first surface 109, of the substrate carrier ring 18. The second surface 110, of the substrate carrier ring 18, is the second surface of constraint for the substrate member 1.

The substrate member 1 is retained within the substrate carrier ring 18, by gravity.

The substrate carrier ring 18, forms a rolling contact with the carrier support track 8. The carrier support track 8 is provided with a first surface 112. The first surface 112 of the carrier support track 8, is an annular ring member, and provided the primary support for the substrate carrier ring 18.

The carrier support track 8, is further provided with a second surface 113. The second surface 113, of the carrier support track 8, is a substantially cylindrical member. The second surface 113, lies perpendicular to the first surface 112, of the carrier support track 8, and acts to proscribe the boundary of rotation for the substrate carrier ring 18.

Figure 6:
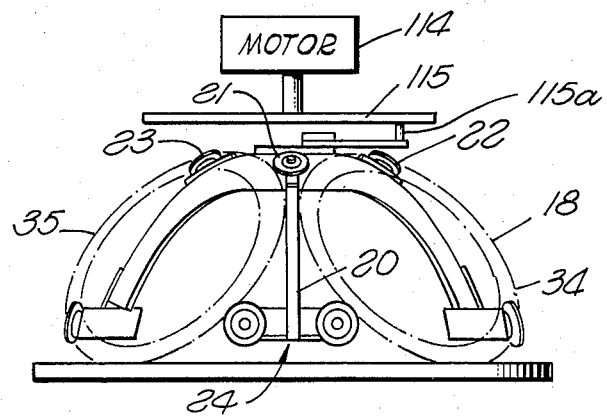
FIG. 6 illustrates the present invention in use.

Referring now to FIG. 6, there is shown a schematic view of the present invention.

The plurality of substrate carrier rings 17, 18 and 19, reside within the frame 20. The plurality of substrate carrier rings 17, 18 and 19, further maintain rolling contact with the plurality of upper rolling assemblies 69, 70 and 71, the plurality of lower rolling assemblies 86, 87 and 88, and the carrier support track 8.

Each of the substrate carrier rings 17, 18 and 19 is provided with a substrate member 1, 29 and 30, respectively. The substrate members 1, 29 and 30 are disposed within the second recesses provided in the substrate carrier rings 17, 18 and 19, and held about their outer peripheries 34, 35 and 36.

A motor 114, is provided for imparting motion to the substrate carrier assembly 16.

When the motor 114 is engaged, the motor 114, directs an eccentric arm 115. The eccentric arm 115, engages the drive arm 62, on the frame 20. As the eccentric arm 115 rotates, the frame 20, is directed to rotate. The rotation imparted to the frame 20 is directed through the frame 20, to the plurality of substrate carrier rings 17, 18 and 19. This rotation of the frame 20, causes the substrate carrier rings 17, 18 and 19 to roll about the boundary of rotation proscribed by the second surface 113 of the carrier support track 8.

The plurality of substrate members 1, are disposed within the substrate carrier rings and the substrate members rotate with the substrate carrier rings.

The rotation of substrate members 1, 29 and 30, provides for an evenly formed, thin evaporated layer upon the surfaces of the plurality of substrate members 1, 29 and 30.

The substrate members 1, 29 and 30 are held about their outer peripheries 34, 35 and 36, thus eliminating the problem shadowing identified in FIG. 1B.

The present invention provides a readily accessible recess for the constraint of the substrate members 1, 29 and 30. The substrate members 1, 29 and 30 are not required to pass through the opening 14 of the carrier support track 8, thus protecting the substrate members 1, 29 and 30 from obvious handling difficulties.

What is claimed is:

1. A vacuum evaporation system for forming a thin evaporated layer on a plurality of substrate members as said substrate members rotate about their central axis within a housing enclosing a plurality of substrates and a plurality of substrate carrier rings, said system comprising:
   a carrier support track;
   rolling engagement surface means for rotatively supporting a plurality of substrate members, which rolling engagement surface means employs a plurality of substantially circular members having a first surface and a second surface, said first surface providing an area of rolling contact with said carrier support track, said second surface having each of said substrate members disposed within a recess provided in said second surface and supporting said substrate members about their outer periphery;
   frame means for supporting said rolling engagement surface means, which frame means employs a plurality of frame members, each of said frame members having a first end portion, said first end portion being primarily coplanar with and mechanically conjoined to each of the other said first end portion, each of said frame members extending away from said first end portions in an arc describing segments of great circles, said frame means including a plurality of roller engagement means rotatably connected thereto;
   rolling engagement means for rotatively supporting said rolling engagement surface means each of said rolling engagement means having a plurality of upper rolling members, and each of said upper rolling members employing a plurality of rollers, and said rolling engagement means further employing a plurality of lower rolling members having a plurality of rollers, said rolling engagement means having a rolling contact surface with said rolling engagement surface means;
   drive arm means mechanically attached to said frame means for imparting a rotational motive force to said frame means, and
   drive means contacting said drive arm means for providing rotational movement between said rolling engagement surface and said rolling contact surface.

2. A vacuum evaporation system as claimed in claim 1, and further comprising:
   said carrier support track being formed as a substantially circular member, having a first surface and a second surface, said first surface forming an annular ring, said second surface lying perpendicular to said first surface and being substantially cylindrical;

said first surface providing a platform for said rolling contact between said rolling engagement surface and said carrier support track;

said second surface acts to proscribe a boundary to the area of rotation of said substrate carrier rings; and said carrier support track is mechanically constrained to said housing.

3. A vacuum evaporation system as claimed in claim 1, and further comprising:

said first surface of said rolling engagement surface means being employed as a track means;

said first surface of said rolling engagement surface means being formed at an angle for contacting said rolling engagement means parallel to the plane of rotation of said rolling engagement means for cooperating with said rolling engagement means for maintaining a relationship between said rolling engagement surface means and said rolling engagement means during rotation of said rolling engagement surface means; and said cooperative relationship including holding, separating and supporting a plurality of said substrate carrier rings.

4. A vacuum evaporation system as claimed in claim 1, and further comprising:

said recess in said second surface in each of said rolling engagement surface means is further provided with an annular ring member and a cylindrical support member;

said annular ring member lies in a plane perpendicular to said plane of rotation of said rollers on said rolling engagement, and said annular ring member provides a support platform for said substrate members;

said cylindrical support member lies perpendicular to said annular ring member; and said cylindrical support member cooperates with said annular ring member to support and hold said substrate members.

5. A vacuum evaporation system as claimed in claim 1, wherein each of said rolling engagement means further comprises:

a substantially cylindrical member having a first surface and a second surface and a groove member disposed between said first surface and said second surface; and said groove member providing a point of contact on said rolling engagement means for engaging said track means of said rolling engagement surface means.

* * * * *